United States Patent
Kato et al.

(10) Patent No.: US 7,508,158 B2
(45) Date of Patent: Mar. 24, 2009

(54) EXCITATION SYSTEM FOR SYNCHRONOUS MACHINE

(75) Inventors: Yoichi Kato, Hitachi (JP); Satoshi Kitamura, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 4 days.

(21) Appl. No.: 11/647,148

(22) Filed: Dec. 29, 2006

(65) Prior Publication Data

US 2007/0145938 A1 Jun. 28, 2007

(51) Int. Cl.
*H02P 1/46* (2006.01)

(52) U.S. Cl. .................. 318/716; 318/154; 363/124

(58) Field of Classification Search .................. 318/700, 318/716, 140, 153, 154; 324/142; 702/60; 363/124

See application file for complete search history.

(56) References Cited

U.S. PATENT DOCUMENTS

| | | | | |
|---|---|---|---|---|
| 5,138,250 A | * | 8/1992 | Capel | .................. 323/283 |
| 5,177,677 A | * | 1/1993 | Nakata et al. | .................. 363/89 |
| 5,371,666 A | * | 12/1994 | Miller | .................. 363/98 |
| 5,514,915 A | * | 5/1996 | Kim et al. | .................. 307/64 |
| 5,661,394 A | * | 8/1997 | Nakao et al. | .................. 323/222 |
| 5,966,299 A | * | 10/1999 | Rhew et al. | .................. 363/124 |
| 2004/0133370 A1 | * | 7/2004 | Lavoie et al. | .................. 702/60 |

FOREIGN PATENT DOCUMENTS

| JP | 2003-250297 | 9/2003 |
|---|---|---|
| JP | 2006-129631 | 5/2006 |

* cited by examiner

*Primary Examiner*—Bentsu Ro
*Assistant Examiner*—David S Luo
(74) *Attorney, Agent, or Firm*—Antonelli, Terry, Stout & Kraus, LLP.

(57) ABSTRACT

A synchronous machine regulator is provided to simplify an adjustment work of current distribution to thyristors, the synchronous machine regulator having a circuit board 32 mounting a gate drive circuit 33 for supplying a gate pulse to each of thyristor bridges constituting a plurality of thyristor rectifiers 44 connected in parallel and supplying excitation current to a field winding 2 of a synchronous machine 1, and phase control means 34 for controlling a phase angle of each gate pulse to be supplied to each thyristor, wherein the current distribution to thyristors is controlled by the phase control means 34.

4 Claims, 2 Drawing Sheets

EXCITATION SYSTEM FOR SYNCHRONOUS MACHINE

BACKGROUND OF THE INVENTION

The present invention relates to a synchronous machine regulator for controlling terminal voltages of a synchronous machine.

In an excitation system for a synchronous machine, a thyristor rectifier excites a field winding of the synchronous machine to control terminal voltages of the synchronous machine, as disclosed, for example, in JP-A-2003-250297. Power is supplied to the thyristor rectifier from an excitation transformer connected to output terminals of the synchronous machine. The thyristor rectifier is constituted of a plurality of three-phase full-wave rectification thyristor bridges connected in parallel. The number of thyristor bridges is generally about one to ten, although the number depends upon a field current value of the synchronous machine.

A synchronous machine regulator receives output voltages and output currents of the synchronous machine via a potential transformer and a current transformer. The signal levels of the output voltages and currents are converted into values suitable for inputs to the regulator by signal conversion units or the like, to be input to a regulation calculation means for excitation regulation. For example, the regulation calculation means is classified into three types depending upon calculation periods. First is high speed signal detection calculation by which output voltages and output currents of the synchronous machine converted by the signal conversion units or the like are sampled to detect signals of synchronous machine voltages, an active power, a reactive power and the like at a predetermined high speed calculation period (e.g., about 1.0 to 2.0 ms). Second is high speed control calculation and the like by which by using the results of the high speed signal detection calculation, control calculation such as control for output voltages of the synchronous machine is conducted at a predetermined high speed calculation period (e.g., about 5.0 to 20.0 ms) to output the calculation results to a gate drive circuit for controlling the thyristor rectifier. Third is low speed control calculation (at a calculation period of about 50.0 to 100.0 ms) and the like for controlling gate pulse outputs to the thyristor rectifier. Namely, the gate drive circuit receives control on/off commands output on the basis of the low speed calculation results, and thereafter outputs signals of the calculation results of the high speed control calculation by amplifying the signals to become signals suitable for the thyristor gates, to thereby adjust a synchronous machine field current and control output voltages of the synchronous machine.

A thyristor rectifier is constituted of a plurality of thyristor bridges connected in parallel. Current distribution among these bridges is adjusted by inductance of each thyristor AC bus, and for fine adjustment, a cut core is inserted into the bus.

As described above, synchronous machine regulation calculation is classified into three types depending upon a difference between calculation periods. When a load of a central processing unit (CPU) is taken into consideration, two control circuit boards are required at minimum, such as a control circuit board mounting one CPU for high speed signal detection calculation and high speed control calculation and a control circuit board mounting one CPU for low speed control calculation. If dual systems are incorporated for redundancy to improve reliability, four control circuit boards are necessary, resulting in corresponding cost-up.

Further, current distribution among thyristors is adjusted by inductance of each thyristor AC bus, and for fine adjustment, a cut core is inserted into the bus. In order to insert a cut core, it is necessary to disassemble the bus and then assemble it again. Therefore, a work cost rises and a cost for the cut core increases. From these reasons, it is difficult to provide an inexpensive synchronous machine regulator and a compact synchronous machine regulator because of an increase in the number of mount components.

SUMMARY OF THE INVENTION

It is an object of the present invention to simplify an adjustment work for current distribution among thyristors.

It is another object of the present invention to make compact a synchronous machine regulator by reducing the number of mount components.

In order to achieve the above objects of the present invention, a synchronous machine regulator comprises: a circuit board mounting a gate drive circuit for supplying a gate pulse to each of thyristors constituting a plurality of thyristor bridges connected in parallel and supplying excitation current to a field winding; and phase control means for controlling a phase angle of each gate pulse to be supplied to each thyristor. The phase control means may be mounted on the circuit board mounting the gate drive circuit.

With this configuration, current to each thyristor of the thyristor rectifiers connected in parallel can be adjusted finely, by adjusting the phase angle of the gate pulse to be supplied to each thyristor of a plurality of thyristor rectifiers connected in parallel. Accordingly, since the current load on each thyristor can be adjusted finely, an adjustment work of thyristor current load can be simplified, and an arrangement for thyristor current load adjustment can be made compact.

In order to achieve the objects of the present invention, a synchronous machine regulator comprises: signal detection calculation means for sampling output voltages and currents of a synchronous machine and calculating status quantities regarding excitation regulation for the synchronous machine at a first calculation period; high speed control calculation means for calculating control commands for controlling the status quantities of the synchronous machine to become target values, at a second calculation period longer than the first calculation period, in accordance with the status quantities calculated by the signal detection calculation means; a gate drive circuit for supplying a gate pulse to each of thyristors constituting a plurality of thyristor bridges connected in parallel and supplying excitation current to a field winding of the synchronous machine; low speed calculation means for controlling outputs, to the gate drive circuit, of the control commands calculated by the high speed control calculation means, at a third calculation period longer than the second calculation period, in accordance with an externally input system control command regarding the synchronous machine; a control circuit board mounting one CPU for executing operations of the signal detection calculation means, the high speed control calculation means and the low speed control calculation means; and a circuit board mounting the gate drive circuit.

It is therefore possible to execute signal detection calculation, high speed control calculation and low speed control calculation by one CPU on one control circuit board. Accordingly, a single control circuit board can conduct operations regarding synchronous machine regulation calculations, and a compact and inexpensive synchronous machine regulator can be realized.

According to the present invention, an adjustment work of current load on each thyristor can be simplified and the synchronous machine regulator can be made compact by reducing the number of mount components.

Other objects, features and advantages of the invention will become apparent from the following description of the embodiments of the invention taken in conjunction with the accompanying drawings.

DETAILED DESCRIPTION OF THE INVENTION

Figure 1:
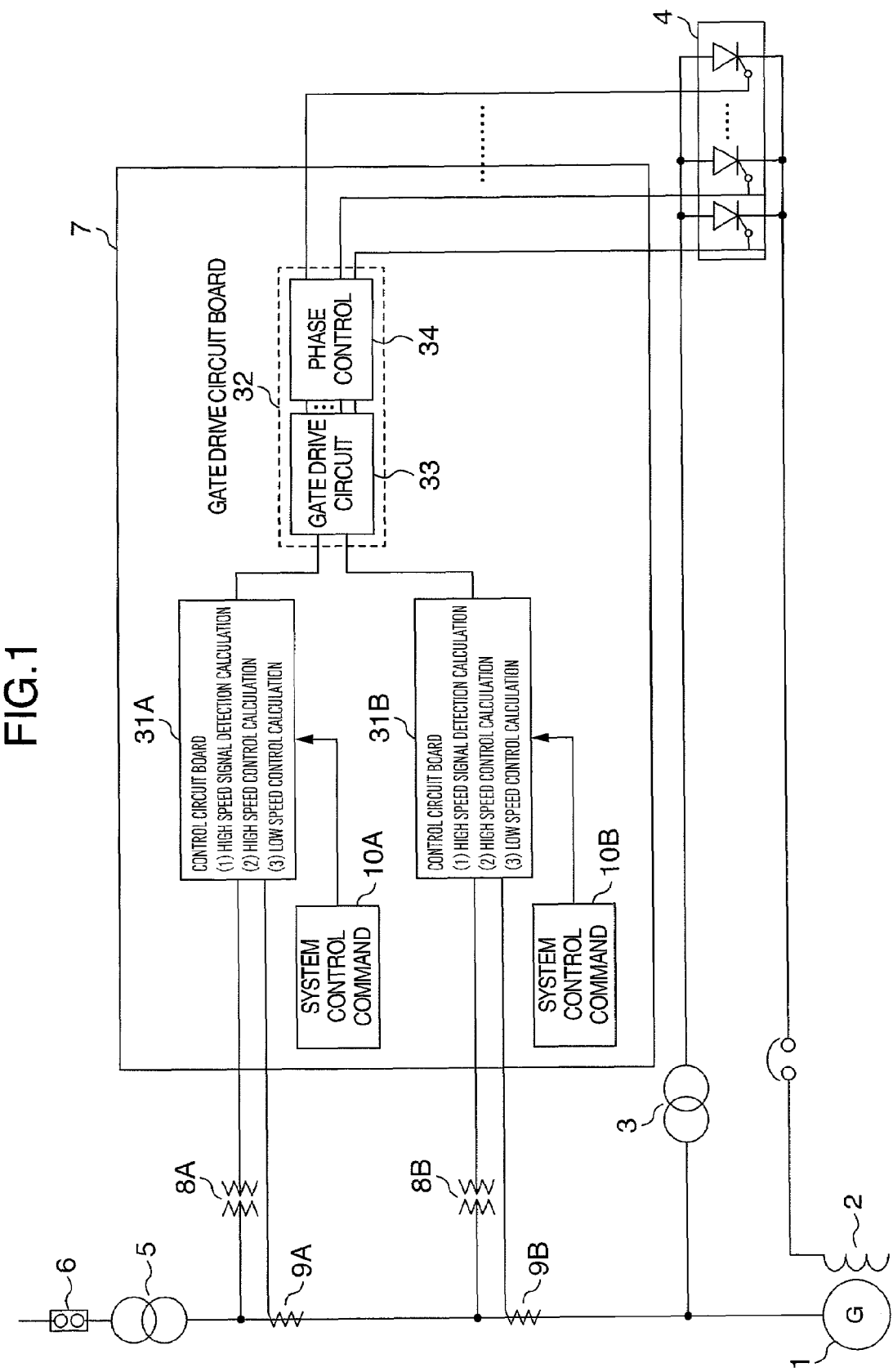
FIG. 1 is a diagram showing the overall configuration of an excitation system for a synchronous machine adopting a synchronous machine regulator according to an embodiment of the present invention.

An embodiment of the invention will now be described with reference to the accompanying drawings. FIG. 1 is a diagram showing the overall configuration of an excitation system for a synchronous machine adopting a synchronous machine regulator according to an embodiment of the present invention. As shown in FIG. 1, outputs of a synchronous machine 1 is raised by a main transformer 5 and supplied to system transmission lines via a generator circuit breaker 6. A field winding 2 of the synchronous machine 1 is excited by an excitation current supplied from a thyristor rectifier 4. The thyristor rectifier 4 is constituted of a plurality of three-phase full-wave rectification thyristor bridges connected in parallel. The number of thyristor bridges is generally about one to ten, although the number depends upon a field current value of the synchronous machine 1. Power is supplied to the thyristor rectifier 4 from an excitation transformer 3 connected to output terminals of the synchronous machine 1.

A synchronous machine regulator 7 is constituted of a dual synchronous machine regulator having two control circuit boards 31A and 31B for executing the same control calculation. Namely, the synchronous machine regulator 7 inputs output voltages of the synchronous machine lowered by potential transformers 8A and 8B to two control circuit boards 31A and 31B. Each of the control circuit boards 31A and 31B compares the input signals to control synchronous machine voltages. Output voltages of the potential transformers 8A and 8B are generally about AC 100 V to AC 120 V and input to analog input units in the control circuit boards 31A and 31B. However, an input range of the analog signal unit is generally about AC 10 V so that the output signals from the potential transformers 8A and 8B cannot be input directly to the control circuit boards 31A and 31B. In this embodiment, therefore, the control circuit boards 31A and 31B have resistors for converting a voltage level to allow outputs of the potential transformers 8A and 8B to be input directly to the control circuit boards 31A and 31B, without involvement of conventional signal conversion units. Similarly, output currents of the synchronous machine 1 are allowed to be directly input from two current transformers 9A and 9B to the control circuit boards 31A and 31B. Status quantity signals of the synchronous machine input from the analog input units are A/D converted into digital signals. A CPU mounted on the control circuit boards 31A and 31B conducts control calculations and the like to be described later. System control commands 10A and 10B such as plant operation commands are input to the control circuit board 31A and 31B.

Figure 2:
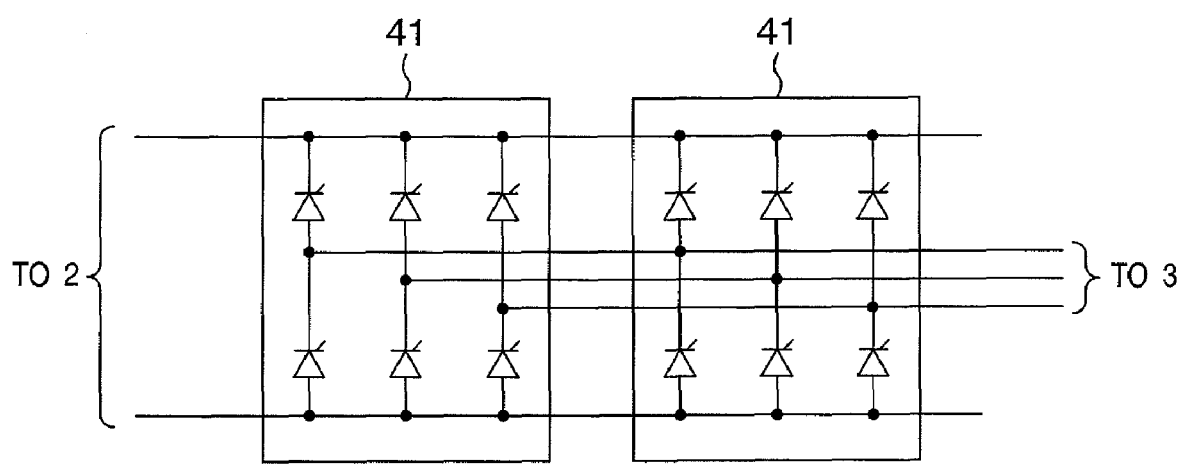
FIG. 2 is a diagram showing the detailed structure of a thyristor rectifier of the embodiment shown in FIG. 1.

Control commands such as thyristor firing angles, which are calculation results by the control circuit boards 31A and 31B, are output to a gate drive circuit board 32. The gate drive circuit board 32 is mounted with a gate drive circuit 33 and phase control switches 34 which are a phase control means for gate pulses. The phase control switches 34 are provided in correspondence with the plurality of thyristor bridges connected in parallel and constituting the thyristor rectifier 4. Although thyristors of only one phase are shown in FIG. 1, as described earlier the thyristor rectifier 4 is preferably constituted of a plurality of thyristor rectifiers 41 connected in parallel and constituting bridges of three-phase full-wave rectification as shown in FIG. 2.

Control calculations to be executed by the control circuit boards 31A and 31B are classified in this embodiment into three types depending upon calculation periods. First is high speed signal detection calculation by which output voltages and currents of the synchronous machine derived from the analog input units are sampled to detect status quantity signals of synchronous machine voltages, an active power, a reactive power and the like at a predetermined high speed calculation period (e.g., about 1.0 to 2.0 ms). Second is high speed control calculation and the like by which by using the results of the high speed signal detection calculation, control calculation such as synchronous machine voltage control (AVR) and system stability control (PSS) is conducted at a predetermined high speed calculation period (e.g., about 5.0 to 20.0 ms) to output the calculation results to the gate drive circuit 33 for controlling the thyristor rectifier 4. Third is low speed control calculation (at a calculation period of about 50.0 to 100.0 ms) and the like which are conducted asynchronously with the high speed control calculation and generate through logical calculation control on/off commands for outputting thyristor firing angle commands as control commands by the high speed control calculation, to the gate drive circuit 33. Namely, the gate drive circuit 33 receives the control on/off commands output on the basis of the low speed calculation results, and thereafter outputs the firing angle commands of the calculation results by the high speed control calculation by amplifying the firing angle commands to become gate pulses suitable for the thyristor gates, to the thyristor rectifier 4, to thereby adjust a synchronous machine field current and control output voltages of the synchronous machine.

As described above, the control circuit boards 31A and 31B of the present embodiment are characterized in that one CPU executes the high speed signal detection calculation, high speed control calculation and low speed control calculation. The calculation periods of these calculations are required to be, as described above, about 1.0 ms for the high speed signal detection calculation, about 5.0 ms for the high speed control calculation, and about 50.0 ms to 100 ms for the low speed control calculation. Accordingly, if these calculations are executed by one CPU, there is a danger of an overload of CPU and the system may become uncontrollable. In order to avoid this, the present embodiment provides the following devices.

(1) A common memory for use with each calculation is provided in the control circuit boards 31A and 31B to thereby shorten an access time to the common memory for each of the high speed signal detection calculation, high speed control calculation and low speed control calculation and shorten an operation time of each calculation by CPU.

(2) Control functions heretofore regarded necessary for synchronous machine voltage regulation are revised and simplified. A load of the high speed control calculation is minimized by calculating only necessary and minimum functions.

The present embodiment is characterized in that through optimization of the calculation processes, even if the three types of the above-described calculations are processed by one CPU, a danger of an overload of CPU and an uncontrollable system can be avoided.

Next, description will be made on the gate drive circuit board 32 which is another feature of the present invention. The thyristor rectifier 4 of the present embodiment is constituted of three-phase full-wave rectification thyristor bridges connected in parallel. Inductance of each AC bus is adjusted so as to evenly distribute current to each thyristor bridge. The gate drive circuit 32 is provided with the phase control switches 34 capable of manual fine adjustment of the phase of each gate pulse for firing the thyristor. The phase control switch 34 can adjust at each thyristor bridge the phase of each gate pulse output from the gate drive circuit 33. For example, if a rated current of the thyristor rectifier 4 is 3,000 A and the number of thyristor bridges connected in parallel is three, it is adjusted that current of 1,000 A is evenly distributed to each thyristor bridge. If it is necessary to finely adjust current flowing through each thyristor bridge, for example, if current over 1,000 A flows through one thyristor bridge, the gate pulse for the thyristor bridge is moved toward the lag phase direction by using the phase control switch 34. Current flowing through the thyristor bridge is squeezed and adjusted toward a reduction direction so that the current balance among the thyristor bridges can be maintained. According to the present embodiment, even if the number of thyristor bridges increases, current flowing through the bridges can be finely adjusted by using the phase control switches 34 on the gate drive circuit board 32, and adjustment cut cores heretofore regarded necessary are dispensable.

It should be further understood by those skilled in the art that although the foregoing description has been made on embodiments of the invention, the invention is not limited thereto and various changes and modifications may be made without departing from the spirit of the invention and the scope of the appended claims.

The inventioned claimed is:

1. A synchronous machine regulator comprising:
a gate drive circuit board mounted with a gate drive circuit for supplying a gate pulse to each of thyristors constituting a plurality of thyristor bridges connected in parallel and supplying excitation current to a field winding of said synchronous machine, and phase control means for controlling the phase angle of the gate pulse to be supplied to each of said thyristors;
signal detection calculation means for sampling output voltages and currents of a synchronous machine and calculating status quantities regarding excitation regulation for said synchronous machine at a first calculation period;
high speed control calculation means for calculating control commands for controlling the status quantities of said synchronous machine to become target values, at a second calculation period longer than said first calculation period, in accordance with the status quantities calculated by said signal detection calculation means;
low speed calculation means for calculating asynchronously with said high speed control on/off command for controlling outputs, to said gate drive circuit, of said control commands calculated by said high speed control calculation means, at a third calculation period longer than said second calculation period, in accordance with an externally input system control command regarding said synchronous machine; and
a control board mounting one CPU for executing operations of said signal detection calculation means, said high speed control calculation means and said low speed control calculation means.

2. A synchronous machine regulator comprising:
signal detection calculation means for sampling output voltages and currents of a synchronous machine and calculating status quantities regarding excitation regulation for said synchronous machine at a first calculation period;
high speed control calculation means for calculating control commands for controlling the status quantities of said synchronous machine to become target values, at a second calculation period longer than said first calculation period, in accordance with the status quantities calculated by said signal detection calculation means;
a gate drive circuit for supplying a gate pulse to each of thyristors constituting a plurality of thyristor bridges connected in parallel and supplying excitation current to a field winding of said synchronous machine;
low speed calculation means for calculating asynchronously with said high speed control calculation means control on/off commands for controlling outputs, to said gate drive circuit, of said control commands calculated by said high speed control calculation means, at a third calculation period longer than said second calculation period, in accordance with an externally input system control command regarding said synchronous machine; and
a control board mounting one CPU for executing operations of said signal detection calculation means, said high speed control calculation means and said low speed control calculation means.

3. The synchronous machine regulator according to claim 1, wherein a common memory to be used by said signal detection calculation means, said high speed control calculation means and said low speed control calculation means is provided in said control board.

4. The synchronous machine regulator according to claim 2, wherein a common memory to be used by said signal detection calculation means, said high speed control calculation means and said low speed control calculation means is provided in said control board.

* * * * *